United States Patent
Chen et al.

(10) Patent No.: US 8,530,266 B1
(45) Date of Patent: Sep. 10, 2013

(54) IMAGE SENSOR HAVING METAL GRID WITH A TRIANGULAR CROSS-SECTION

(75) Inventors: Gang Chen, San Jose, CA (US); Duli Mao, Sunnyvale, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/552,330

(22) Filed: Jul. 18, 2012

(51) Int. Cl.
| | |
|---|---|
| H01L 21/00 | (2006.01) |
| H01L 21/44 | (2006.01) |
| H01L 21/48 | (2006.01) |
| H01L 21/50 | (2006.01) |
| H01L 31/062 | (2012.01) |
| H01L 31/113 | (2006.01) |
| H01L 31/0232 | (2006.01) |
| H01L 31/00 | (2006.01) |
| H01L 23/04 | (2006.01) |

(52) U.S. Cl.
USPC ............ 438/73; 438/106; 438/121; 257/291; 257/432; 257/447; 257/730; 257/E31.124; 257/E31.125

(58) Field of Classification Search
USPC .................. 438/73, 106, 121; 257/291, 432, 257/447, 730, E31.124, E31.125
See application file for complete search history.

(56) References Cited

U.S. PATENT DOCUMENTS

| | | | |
|---|---|---|---|
| 5,952,645 A | 9/1999 | Wang et al. | |
| 7,315,014 B2 | 1/2008 | Lee et al. | |
| 7,859,033 B2 | 12/2010 | Brady | |
| 7,973,380 B2 * | 7/2011 | Hsu et al. | 257/460 |
| 8,373,243 B2 * | 2/2013 | Tai et al. | 257/447 |
| 2003/0038326 A1 | 2/2003 | Fasen et al. | |
| 2006/0192083 A1 | 8/2006 | Fu et al. | |
| 2007/0187787 A1 | 8/2007 | Ackerson et al. | |
| 2007/0238035 A1 | 10/2007 | Holscher et al. | |
| 2008/0036020 A1 | 2/2008 | Ko et al. | |
| 2009/0200625 A1 | 8/2009 | Venezia et al. | |
| 2009/0272880 A1 | 11/2009 | Stanton et al. | |
| 2011/0108938 A1 | 5/2011 | Nozaki et al. | |

OTHER PUBLICATIONS

Hsu, T.H. et al., "Light Guide for Pixel Crosstalk Improvement in Deep Submicron CMOS Image Sensor", IEEE Electron Device Letters, Jan. 2004, pp. 22-24, vol. 25, No. 1.
Mosher, Lance et al., "Double-Exposure Grayscale Photolithography", Journal of Microelectromechanical Systems, Apr. 2009, pp. 308-315, vol. 18, No. 2.
Wang, Yu et al., "Review Report of 'Microlens and Micro-Wedge Optical Concentrator Technology for Solid State Image Sensor'", NASA Jet Propulsion Lab, M/S 300-315, California Institute of Technology, Pasadena, CA 91009.

* cited by examiner

*Primary Examiner* — David S Blum
(74) *Attorney, Agent, or Firm* — Blakely Sokoloff Taylor & Zafman LLP

(57) ABSTRACT

A backside illuminated image sensor includes a substrate layer having a frontside and a backside. An array of photosensitive pixels is disposed within the substrate layer and is sensitive to light incident through the backside of the substrate layer. A metal grid is disposed over the backside of the substrate layer. The metal grid surrounds each of the photosensitive pixels and defines optical apertures for receiving the light into the photosensitive pixels through the backside. The metal grid includes intersecting wires each having a triangular cross-section. A material layer surrounds the metal grid.

21 Claims, 7 Drawing Sheets

US 8,530,266 B1

IMAGE SENSOR HAVING METAL GRID WITH A TRIANGULAR CROSS-SECTION

TECHNICAL FIELD

This disclosure relates generally to image sensors, and in particular but not exclusively, relates to CMOS image sensors.

BACKGROUND INFORMATION

Conventional image sensors may be fabricated from a complementary metal oxide semiconductor (CMOS) technology or from charge coupled device (CCD) technology. CMOS image sensors include an array of pixels disposed on a substrate, each pixel including a photosensitive element, such as a photodiode, for example. The photosensitive element and a floating diffusion region may be coupled together when an associated transfer transistor is turned on, to transfer the charge from the photosensitive element to the floating diffusion. There may be one or more layers of metal, polysilicon, diffusions, etc., disposed on the substrate as well.

The typical image sensor operates as follows. Light is incident on the micro-lens, which the micro-lens focuses the light onto the photosensitive element through a filter. The photosensitive element converts the light into an electrical signal proportional to the intensity of the incident light. The electrical signal may be coupled to amplification and readout circuitry such as a CMOS transistor to generate an image based on the captured light.

Conventional image sensors suffer from some limitations. In image sensors that use front side illumination ("FSI"), the layers of metal are disposed between micro-lenses and the photosensitive elements. During fabrication of image sensors that use FSI technology, a channel is therefore created through the metal layers for light to travel from the micro-lens to the photosensitive elements. However, internal reflections at the interface between different materials can cause back reflections, which in turn can reflect off the bottom side of the metal layers into adjacent pixels resulting in optical crosstalk.

One solution is to use back side illumination ("BSI"). In image sensors that use BSI, the layers of metal, polysilicon, diffusions, etc., are on one side of the substrate (front side) and the photosensitive elements are exposed to light from the other side of the substrate (backside). Thus, there is no need to create a path through the frontside metal stack to the photosensitive element. Rather, there is an unobstructed direct path from the backside to the photosensitive element. BSI image sensors suffer from limitations as well. For example, as the pixel size of BSI image sensors becomes smaller, it is increasingly difficult to focus incident light onto the photosensitive element. As a result, there can be crosstalk among the pixels. Crosstalk creates undesirable noise in the image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of a system and methods of fabrication of an image sensor having a backside metal grid with a triangular cross-section are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
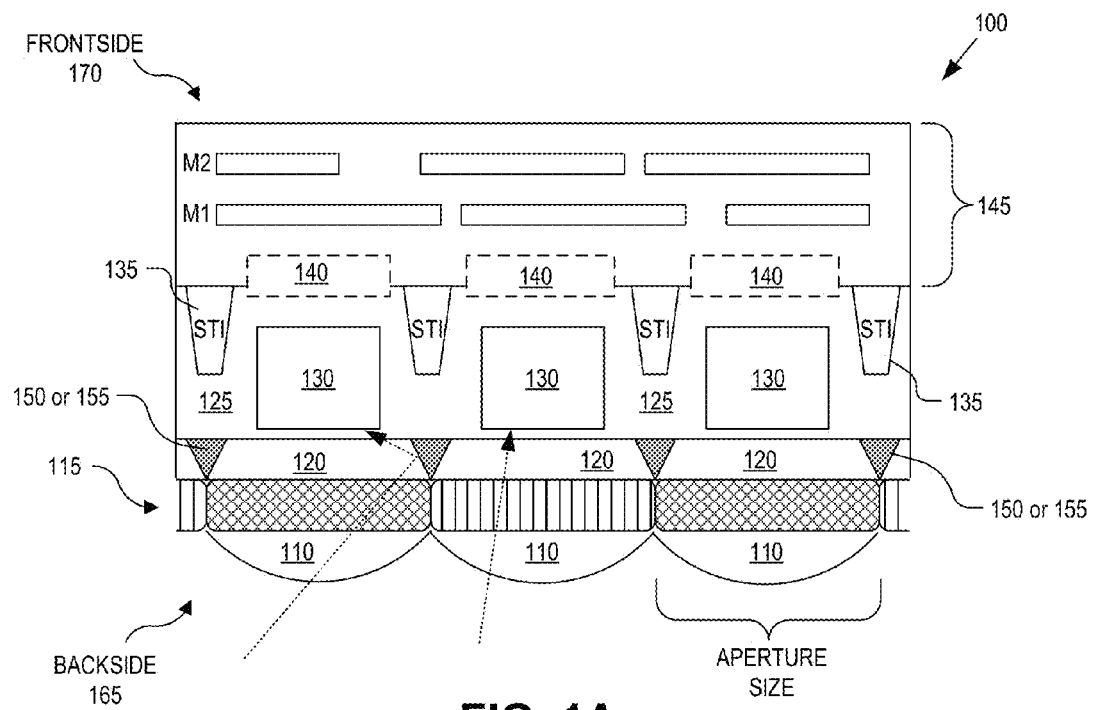
FIG. 1A is a cross-sectional view of a portion of a backside illuminated ("BSI") image sensor having a metal grid with a triangular cross-section disposed on the backside, in accordance with an embodiment of the disclosure.
Figure 1B:
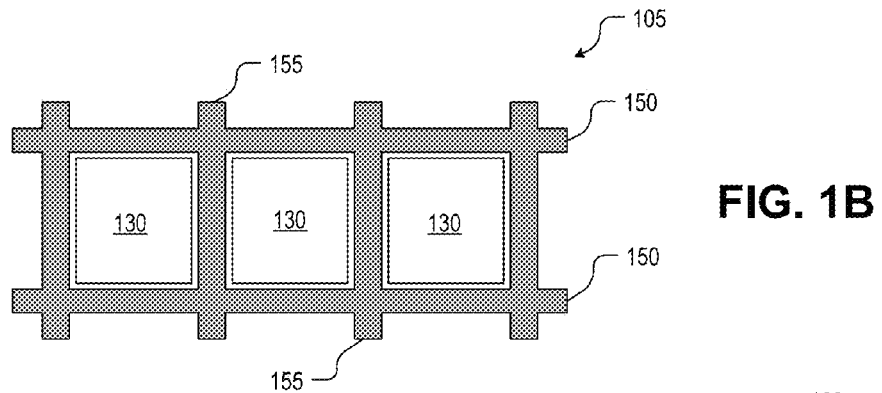
FIG. 1B is a layout view of the metal grid disposed on the backside of the BSI image sensor, in accordance with an embodiment of the disclosure.
Figure 1C:
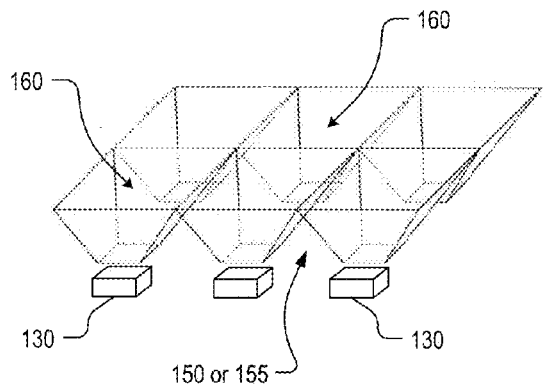
FIG. 1C is a perspective view of optical apertures defined by the metal grid disposed on the backside of the BSI image sensor, in accordance with an embodiment of the disclosure.

FIGS. 1A-C illustrate a backside illuminated ("BSI") image sensor 100 having a metal grid 105 with a triangular cross-section disposed on the backside, in accordance with an embodiment of the disclosure. FIG. 1A is a cross-section view of a portion of BSI image sensor 100, FIG. 1B is a layout view of metal grid 105, and FIG. 1C is a perspective view of optical apertures formed by metal grid 105, in accordance with an embodiment of the disclosure.

The illustrated embodiment of BSI image sensor 100 includes metal grid 105, microlenses 110, color filters of a color filter array ("CFA") 115, a planarization layer 120, a substrate layer 125, photosensitive regions 130, shallow trench isolations ("STI") 135, pixel circuitry 140, and a metal stack 145. The illustrated embodiment of metal stack 145 includes metal layers M1 and M2 separated by interlayer dielectric material. Metal stack 145 is disposed over frontside 170 of substrate layer 125. BSI image sensor 100 includes an array of photosensitive pixels that are sensitive to light incident through backside 165 of substrate layer 125. Each photosensitive pixel includes a corresponding photosensitive region 130 and pixel circuitry 140 and are electrically isolated from each other via STI 135. In one embodiment, an antireflective ("AR") layer is disposed between substrate layer 125 and metal grid 105 (not illustrated).

The illustrated embodiment of metal grid 105 includes horizontal wires 150 that intersect vertical wires 155 substantially perpendicular to each other. The intersecting grid pattern formed by metal grid 105 outlines photosensitive regions 130 and defines optical apertures 160 through backside 165 of substrate layer 125. Wires 150 and 155 have substantially triangular cross-sections (or profiles). The triangular cross-section of intersecting wires 150 and 155 define a sort of inverted and truncated pyramid-like optical aperture 160.

Figure 2:
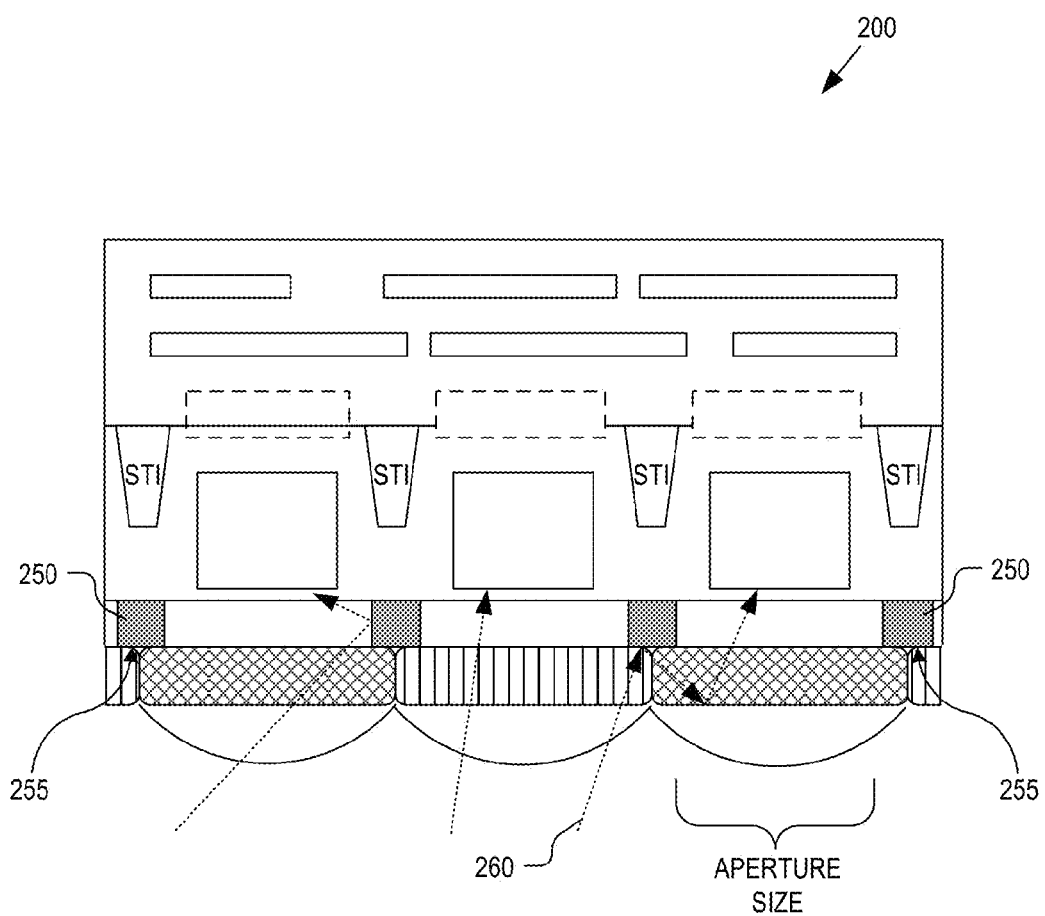
FIG. 2 is a cross-sectional view of a portion of a BSI image sensor having a metal grid with a rectangular cross-section disposed on the backside.

Metal grid 105 servers a number of useful functions. First, the triangular cross-section serves to collect light incident on backside 165 from a greater number of angles and positions. Light entering from a steep angle is reflected on the slanted side of wires 150 or 155 back towards the center of the pixel and into photosensitive region 130 where it is collected. This increases the quantum efficiency ("QE") of BSI image sensor 100. As image sensors continue to decrease in size, the QE number becomes increasingly important. Second, by angling wires 150 and 155 to a point, the optical aperture size is increased and fewer incident light rays are blocked. By contrast, with reference to FIG. 2, the width of wires 250 reduce the aperture size through which light may be accepted, thereby reducing the QE of image sensor 200 relative to BSI image sensor 100. As pixel dimensions continue to shrink below 2 microns, the width of wires 250 can significantly reduce the fill factor of the pixel array, thereby reducing QE. Third, the rectangular cross-section of wires 250 provides a reflective surface 255 that reflects incident light 260. The back reflected light 260 may then reflect again at any of the interfaces between material layers and end up being collected by an adjacent pixel. This is optical cross-talk (also referred to as petal flare), which detrimentally impacts the image quality. Thus, metal grid 105 with its triangular cross-section reduces light blocking, reduces back reflections and associated crosstalk, and increases the amount of photons that are captured by photosensitive regions 130, as compared to the rectangular wires illustrated in FIG. 2. Fourth, metal grid 105 with its triangular cross-section reduces the "shadowing effect" caused by a wire grid over a pixel array, thereby improving chief-ray-angle performance and improving sensitivity uniformity across the whole pixel array.

Wires 150 and 155 may be fabricated of various types of metal to reflect light. For example, wires 150 and 155 of metal grid 105 maybe fabricated of Aluminum (Al), Copper (Cu), Tungsten (W), or otherwise. For an image sensor having pixels on the order of 2 microns in size, wires 150 and 155 may have a width and height of approximately 0.1 to 0.3 microns. Of course other dimensions may be used.

The illustrated embodiment of BSI image sensor 100 may be fabricated of the following example materials. In one embodiment, substrate layer 125 is a P type epitaxial layer, photosensitive regions 130 are N doped regions, pixel circuitry 140 are disposed in or on a p-well disposed in the front side of substrate layer 125, and STI 135 are oxide filled trenches and/or doped regions. Of course, the dopant polarities can be reversed such that photo-generated holes are collected in photosensitive regions 130 as opposed to photo-generated electrons. CFA 115 may represent a Bayer pattern color filter including red, green, and blue filters. Of course, other CFA patterns and colors may also be used (e.g., cyan, yellow, magenta). Microlenses 110 may be fabricated of clear polymer material that is patterned and reflowed using surface tension to achieve the curved lens shape. Planarization layer 120 is fabricated of an optically transmissive material, such as polymethylmethacrylate ("PMMA"), silicon nitride, or otherwise. Of course, other fabrication materials and techniques may be used.

Figure 3:
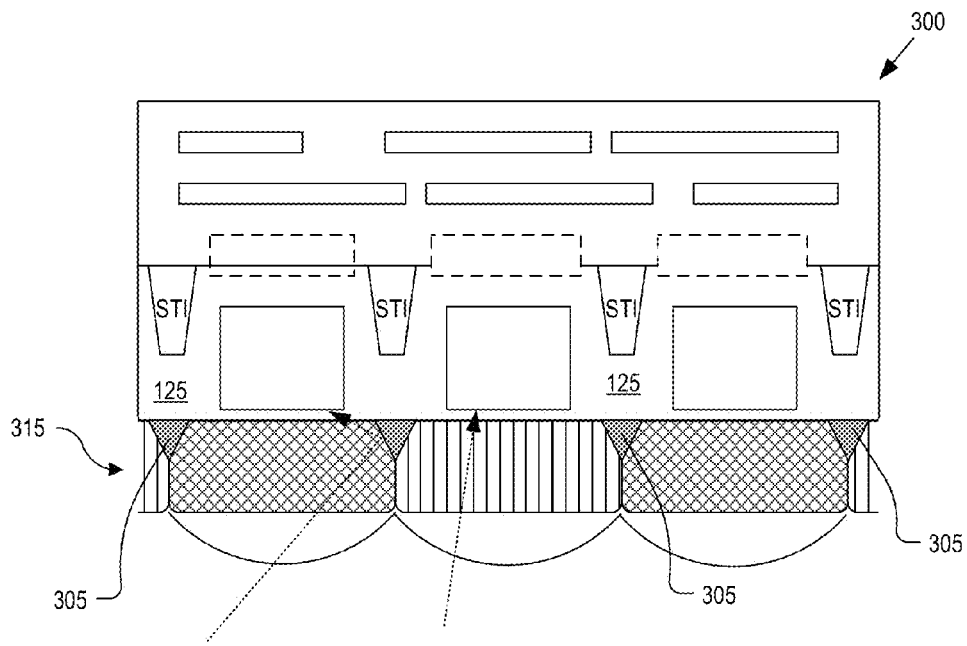
FIG. 3 is a cross-sectional view of a portion of a BSI image sensor having a metal grid extended partially within a color filter array ("CFA"), in accordance with an embodiment of the disclosure.

FIG. 3 is a cross-sectional view of a portion of a BSI image sensor 300 having a metal grid 305 that extends partially within a CFA 315, in accordance with an embodiment of the disclosure. BSI image sensor 300 is similar to BSI image sensor 100 except that planarization layer 120 is not included; rather, CFA 315 fills in the optical aperture defined by metal grid 305 and surrounds metal grid 305. Thus, metal grid 305 is embedded within CFA 315 and formed on a surface plane on the backside of substrate layer 125. CFA 315 extends down to that surface plane. By omitting planarization layer 120, the number of fabrication steps of BSI image sensor 300 may be reduced relative to BSI image sensor 100. Furthermore, one material interface between different material layers is also eliminated with the elimination of planarization layer 120, which can improve QE.

Figure 4:
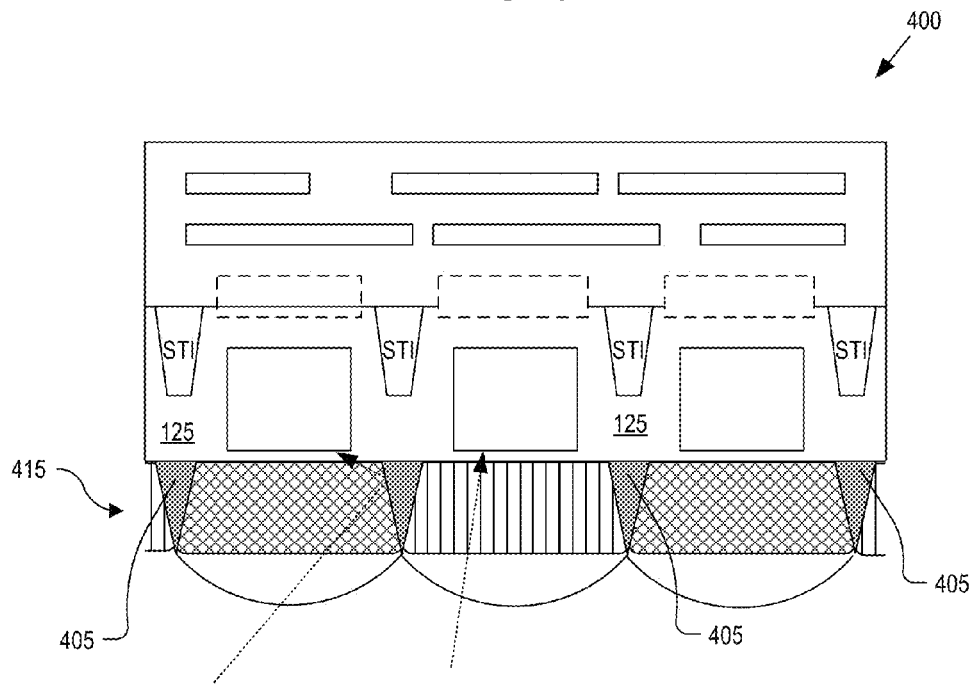
FIG. 4 is a cross-sectional view of a portion of a BSI image sensor having a metal grid extending entirely through a CFA, in accordance with an embodiment of the disclosure.

FIG. 4 is a cross-sectional view of a portion of a BSI image sensor 400 having a metal grid 405 extending entirely through a CFA 415, in accordance with an embodiment of the disclosure. BSI image sensor 400 is similar to BSI image sensor 300 except that metal grid 405 extends entirely through CFA 415. Having metal grid 405 extend further serves to improve crosstalk immunity compared to the embodiment of FIG. 3. The benefits provided by metal grid 405 (or any of the other metal grids) may render the microlens array unnecessary. Accordingly, in some embodiments, the microlens array may be omitted from any of the illustrated embodiments.

Figure 5A:
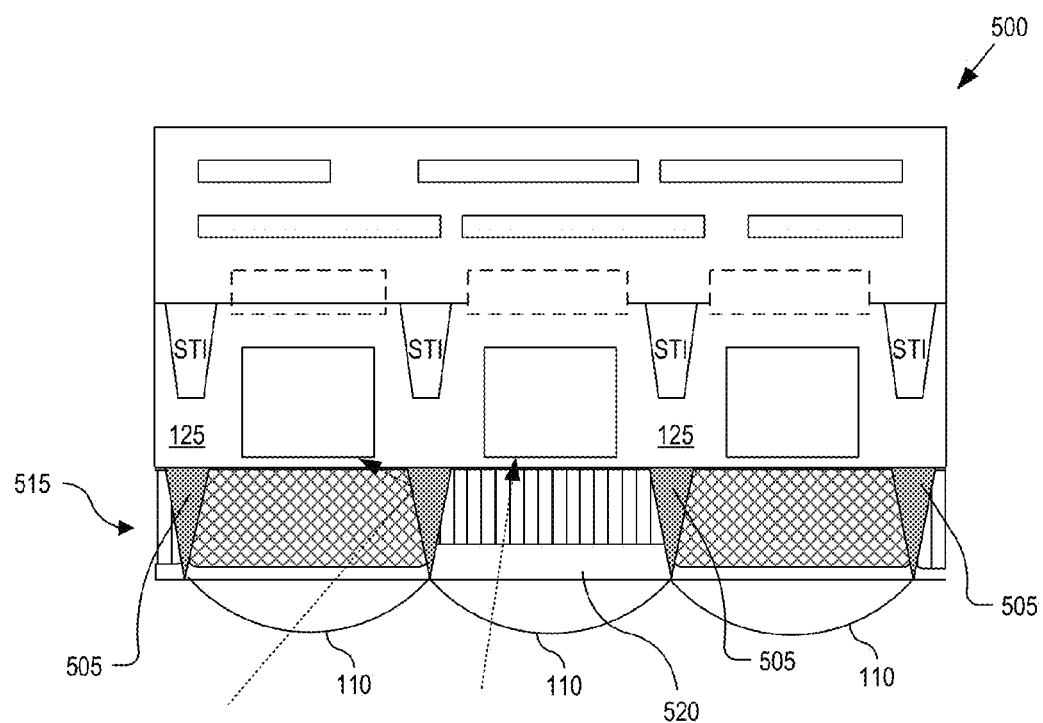
FIG. 5A is a cross-sectional view of a portion of a BSI image sensor having a metal grid extending entirely through a CFA and through a planarization layer disposed between the CFA and a microlens array, in accordance with an embodiment of the disclosure.

FIG. 5A is a cross-sectional view of a portion of a BSI image sensor 500 having a metal grid 505 extending entirely through a CFA 515 and into a planarization layer 520 disposed between the CFA 515 and microlens array 110, in accordance with an embodiment of the disclosure. BSI image sensor 500 is similar to BSI image sensor 400 except that a planarization layer 520 is disposed over the CFA 515 and metal grid 505 extends into planarization layer 520. The triangular wires of metal grid 505 may merely extend partially into planarization layer 520 or extend entirely through planarization layer 520 and terminate on the planar base surface created by planarization layer 520. Planarization layer 520 provides this planar surface base upon which an array of microlenses 110 may be disposed. Due to the absorption characteristics of the different colored elements of CFA 515, the different colored optical filters may have different thicknesses. Planarization layer 520 compensates for these height differences. In one embodiment, planarization layer 520 is fabricated of a clear or transparent polymer material.

Figure 5B:
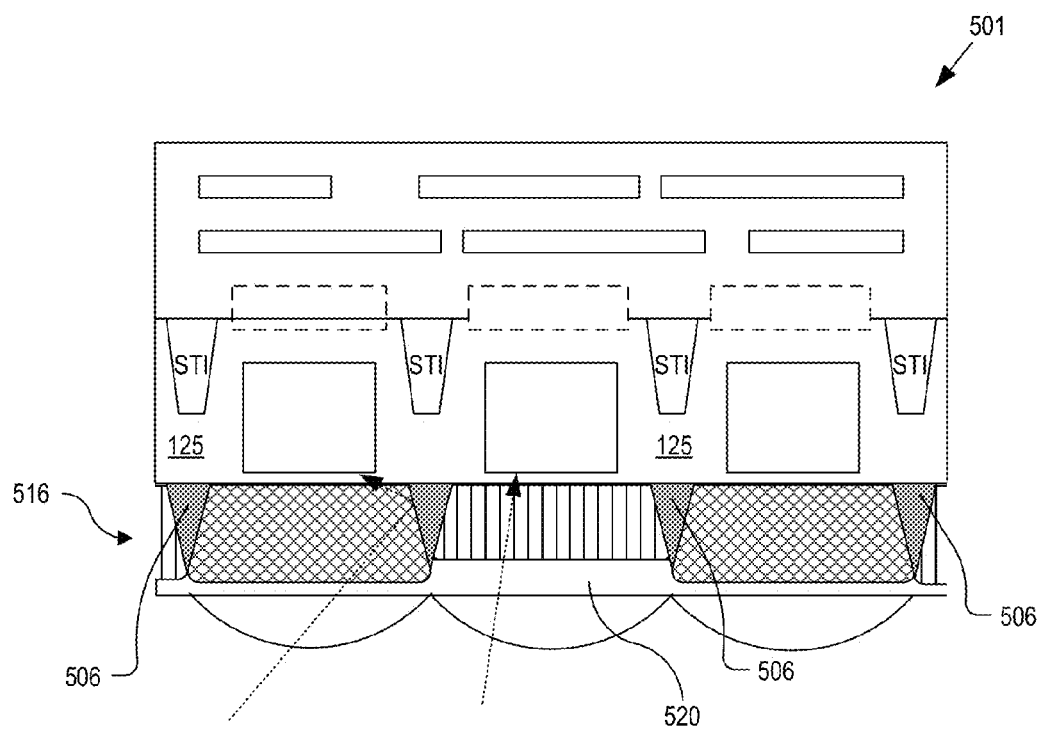
FIG. 5B is a cross-sectional view of a portion of a BSI image sensor having a metal grid extending entirely through a CFA to a planarization layer disposed between the CFA and a microlens array, in accordance with an embodiment of the disclosure.

FIG. 5B is a cross-sectional view of a portion of a BSI image sensor 501 having a metal grid 506 that extends entirely through CFA 516 to planarization layer 520, in accordance with an embodiment of the disclosure. BSI image sensor 501 is similar to BSI image sensor 500 except that the triangular wires of metal grid 506 terminate at planarization layer 520 and do not extend into planarization layer 520.

Figure 6A:
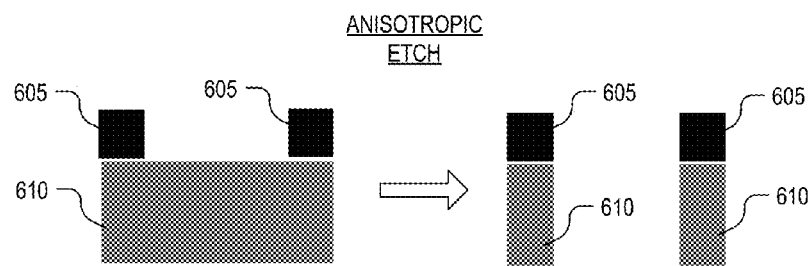
FIGS. 6A-C illustrates a technique for fabricating a metal grid having a triangular cross-section using isotropic and anisotropic etches, in accordance with an embodiment of the disclosure.
Figure 6B:
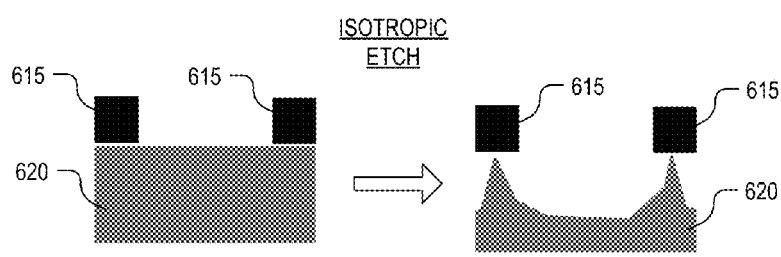
Figure 6C:
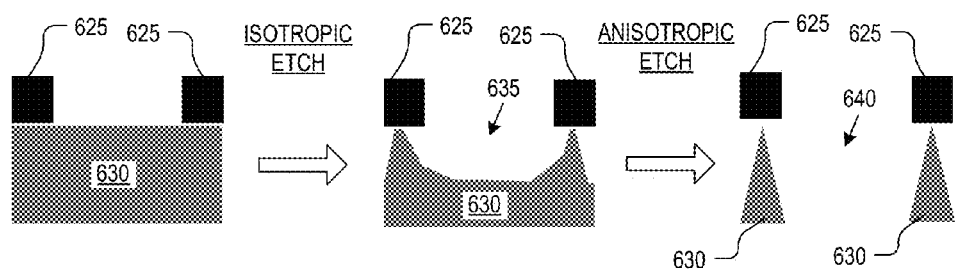

FIGS. 6A-C illustrates a technique for fabricating a metal grid having a triangular cross-section using isotropic and anisotropic etches, in accordance with an embodiment of the disclosure. FIG. 6A illustrates the result of an anisotropic etch performed on a metal layer 610 covered by a mask 605. An anisotropic etch may be performed using a reactive-ion etch ("RIE") or deep RIE ("DRIE") using a chemically reactive plasma or dry etchant. As illustrated, anisotropic etches create steep-sided trenches. FIG. 6B illustrates the result of an isotropic etch performed on a metal layer 620 covered by a mask 615. An isotropic etch is typically performed using a liquid-phase etchant (also referred to as wet etchant), which undercuts the mask and creates cavities with rounded sidewalls.

FIG. 6C illustrates an iterative, multi-step etching process for fabricating a metal grid formed of wires having triangular cross-sections. First, a mask 625 is formed over a metal layer 630. Second, an isotropic etch is performed on metal layer 630 using mask 625. The isotropic etch undercuts mask 625 and creates recess 635 in metal layer 630 having curved sides. The degree of undercutting is called bias. Next, an anisotropic etch is performed, which removes portions of metal layer 630 from the floor within recess 635. The isotropic and anisotropic etches are iteratively repeated, each time undercutting the mask and removing material from the floor of recess 635 with the isotropic etch and then removing more from the floor with the anisotropic etch. The resulting recess 640, after several iterations (e.g., 4 to 10 iterations) defines the inverted, truncated, pyramid-like optical aperture 160, illustrated in FIG. 1C.

Of course, other techniques may be used to fabricate any of the metal grids described above. For example, grayscale photolithography may be used to define a metal grid having wires with substantially triangular cross-sections.

Figure 7:
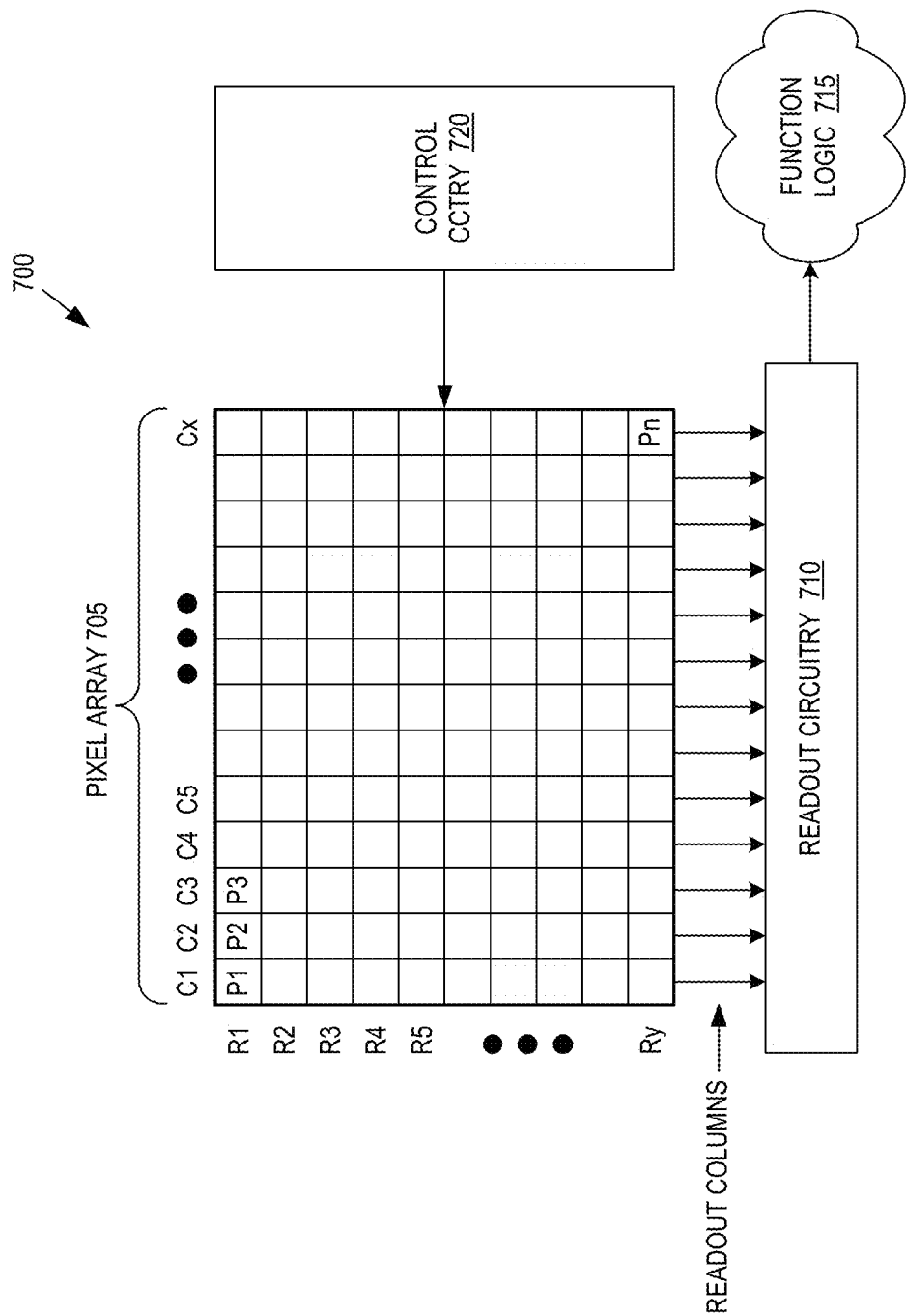
FIG. 7 is a functional block diagram illustrating a BSI imaging system, in accordance with an embodiment of the disclosure.

FIG. 7 is a block diagram illustrating a BSI imaging system 700, in accordance with an embodiment of the disclosure. The illustrated embodiment of BSI imaging system 700 includes a pixel array 705, readout circuitry 710, function logic 715, and control circuitry 720. BSI imaging system 700 may be fabricated with a backside metal grid, similar to any of the metal grids described above. Furthermore, any of the various features described in connection with FIGS. 1A-C, 3, 4, 5A, and 5B may be combined in various different manners to form hybrid embodiments.

Pixel array 705 is a two-dimensional ("2D") array of backside illuminated imaging sensors or pixels (e.g., pixels P1, P2..., Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 710 and transferred to function logic 715. Readout circuitry 710 may include amplification circuitry, analog-to-digital ("ADC") conversion circuitry, or otherwise. Function logic 715 may simply store the image data or even manipulate the image data by applying post image effects (e.g., crop, rotate, remove red eye, adjust brightness, adjust contrast, or otherwise). In one embodiment, readout circuitry 710 may readout a row of image data at a time along readout column lines (illustrated) or may readout the image data using a variety of other techniques (not illustrated), such as a serial readout or a full parallel readout of all pixels simultaneously.

Control circuitry 720 is coupled to pixel array 705 to control operational characteristic of pixel array 705. For example, control circuitry 720 may generate a shutter signal for controlling image acquisition. In one embodiment, the shutter signal is a global shutter signal for simultaneously enabling all pixels within pixel array 705 to simultaneously capture their respective image data during a single acquisition window. In an alternative embodiment, the shutter signal is a rolling shutter signal whereby each row, column, or group of pixels is sequentially enabled during consecutive acquisition windows.

Figure 8:
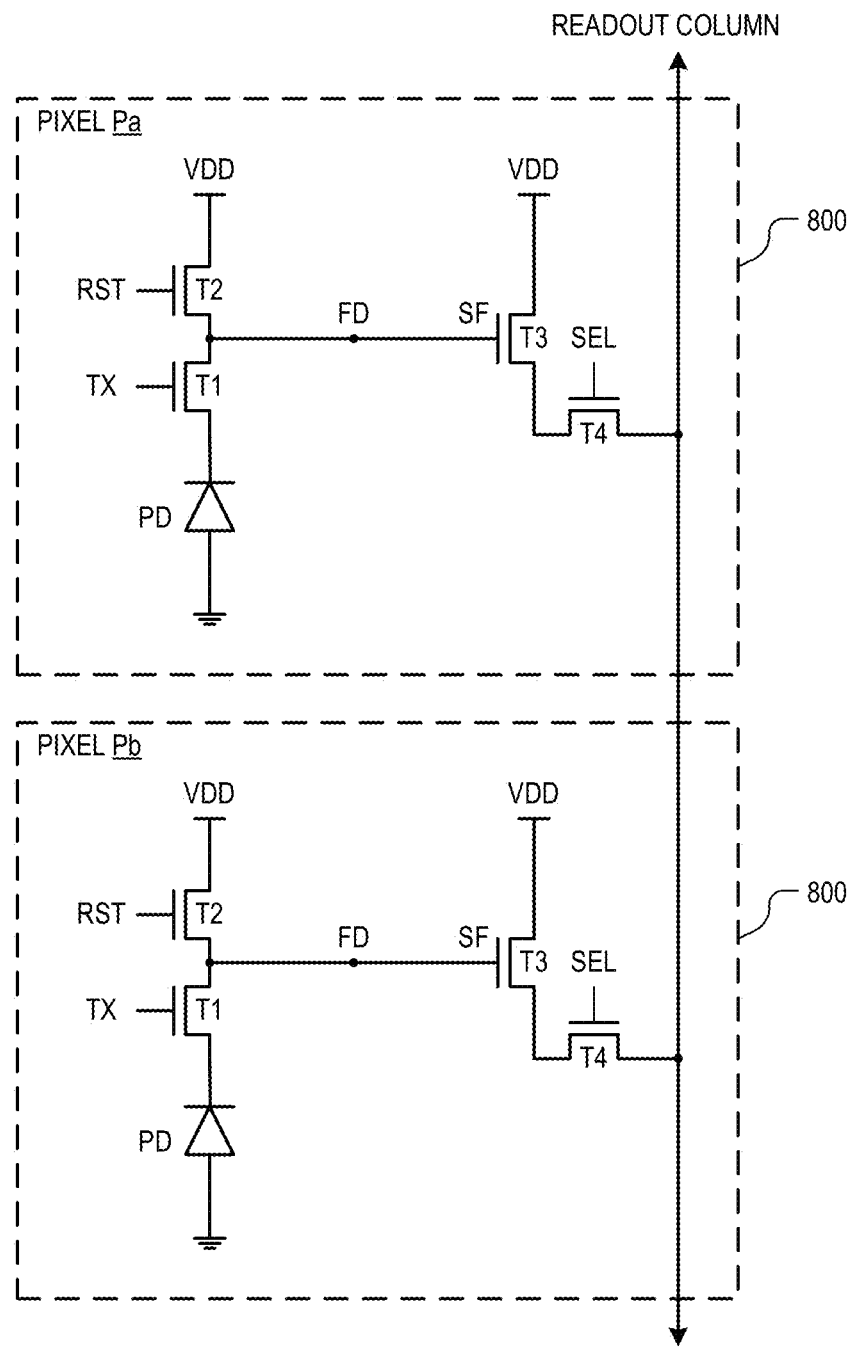
FIG. 8 is a circuit diagram illustrating pixel circuitry of two 4T pixels within a BSI imaging system, in accordance with an embodiment of the disclosure.

FIG. 8 is a circuit diagram illustrating pixel circuitry 800 of two four-transistor ("4T") pixels within a BSI imaging array, in accordance with an embodiment of the invention. Pixel circuitry 800 is one possible pixel circuitry architecture for implementing each pixel within pixel array 700 of FIG. 7. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 8, pixels Pa and Pb are arranged in two rows and one column. The illustrated embodiment of each pixel circuitry 800 includes a photodiode PD, a transfer transistor T1, a reset transistor T2, a source-follower ("SF") transistor T3, a select transistor T4, and a storage capacitor C1. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 800 to the readout column line under control of a select signal SEL. In one embodiment, the TX signal, the RST signal, and the SEL signal are generated by control circuitry 720.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated ("BSI") image sensor, comprising:
   a substrate layer including a frontside and a backside;
   an array of photosensitive pixels disposed within the substrate layer and sensitive to light incident through the backside of the substrate layer;
   a metal grid disposed over the backside of the substrate layer, the metal grid surrounding each of the photosensitive pixels and defining optical apertures for receiving the light into the photosensitive pixels through the backside, the metal grid including intersecting wires each having a triangular cross-section; and
   a material layer surrounding the metal grid.

2. The BSI image sensor of claim 1, wherein the metal grid comprises:
   first metal wires running substantially parallel to each other along a first direction; and
   second metal wires running substantially parallel to each other along a second direction,
   wherein the first and second directions are substantially orthogonal,
   wherein the first and second metal wires are disposed on a common surface plane.

3. The BSI image sensor of claim 1, wherein the material layer comprises a planarization filler material that buries the metal grid to create a planar surface, the BSI image sensor, further comprising:
   a color filter array disposed over the planar surface of the planarization filler material on the backside.

4. The BSI image sensor of claim 3, further comprising:
   a microlens array disposed over the color filter array on the backside; and
   a planarization layer disposed between the color filter array and the microlens array.

5. The BSI image sensor of claim 1, wherein the material layer comprises a color filter array disposed over the backside, wherein the metal grid extends into the color filter array and the color filter array fills the optical apertures defined by the metal grid.

6. The BSI image sensor of claim 5, wherein the metal grid extends through an entire thickness of the color filter array.

7. The BSI image sensor of claim 5, further comprising:
   a microlens array disposed over the color filter array on the backside.

8. The BSI image sensor of claim 7, further comprising:
   a planarization layer disposed between the color filter array and the microlens array, wherein the metal grid extends into the planarization layer.

9. The BSI image sensor of claim 1, further comprising:
   an antireflective layer disposed between the substrate layer and the metal grid.

10. The BSI image sensor of claim 1, wherein each of the photosensitive pixels includes a photosensitive region disposed within the substrate layer and pixel circuitry disposed in or on the frontside of the substrate layer, the BSI image sensor further comprising:
    a metal stack disposed over the array of photosensitive pixels on the frontside and coupled to route signals to or from the pixel circuitry.

11. A method of fabricating a backside illuminated ("BSI") image sensor, the method comprising:
    forming an array of photosensitive pixels within a substrate layer and oriented to be sensitive to light incident through a backside of the substrate layer;
    forming a metal grid over the backside of the substrate layer, the metal grid surrounding each of the photosensitive pixels and defining optical apertures for receiving the light into the photosensitive pixels through the backside, the metal grid including intersecting wires each having a triangular cross-section; and
    forming a material layer surrounding the metal grid.

12. The method of claim 11, wherein forming the metal grid comprises:
    forming a metal layer over the backside of the substrate layer;
    forming an etching mask over the metal layer, the etching mask defining a grid pattern that outlines the optical apertures; and
    iteratively performing isotropic and anisotropic etches on the metal layer covered with the etching mask to undercut the mask and to create recesses in the metal layer coinciding with the optical apertures and to form the wires of the metal grid each having the triangular cross-section.

13. The method of claim 11, wherein the forming the metal grid comprises:
    forming a metal layer over the backside of the substrate layer; and
    performing grayscale photolithography to form the wires of the metal grid having the triangular cross-section.

14. The method of claim 11, wherein the metal grid comprises:
    first metal wires running substantially parallel to each other along a first direction; and
    second metal wires running substantially parallel to each other along a second direction,
    wherein the first and second directions are substantially orthogonal,
    wherein the first and second metal wires are disposed on a common surface plane.

15. The method of claim 11, wherein the material layer comprises a planarization filler material that buries the metal grid to create a planar surface, the method, further comprising:
    forming a color filter array disposed over the planar surface of the planarization filler material on the backside.

16. The method of claim 15, further comprising:
    forming a microlens array disposed over the color filter array on the backside; and
    forming a planarization layer disposed between the color filter array and the microlens array.

17. The method of claim 11, wherein the material layer comprises a color filter array disposed over the backside, wherein the metal grid extends into the color filter array and the color filter array fills the optical apertures defined by the metal grid.

18. The method of claim 17, wherein the metal grid extends through an entire thickness of the color filter array.

19. The method of claim 17, further comprising:
    forming a microlens array disposed over the color filter array on the backside.

20. The method of claim 19, further comprising:
    forming a planarization layer disposed between the color filter array and the microlens array, wherein the metal grid extends into the planarization layer.

21. The method of claim 11, wherein each of the photosensitive pixels includes a photosensitive region disposed within the substrate layer and pixel circuitry disposed in or on a frontside of the substrate layer, the method further comprising:

forming a metal stack disposed over the array of photosensitive pixels on the frontside that is coupled to route signals to or from the pixel circuitry.

* * * * *